(12) United States Patent
Cote et al.

(10) Patent No.: US 6,548,901 B1
(45) Date of Patent: Apr. 15, 2003

(54) CU/LOW-K BEOL WITH NONCONCURRENT HYBRID DIELECTRIC INTERFACE

(75) Inventors: William Cote, Poughkeepsie, NY (US); Timothy Joseph Dalton, Ridgefield, CT (US); Daniel Charles Edelstein, White Plains, NY (US); Stephen McConnell Gates, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/596,750

(22) Filed: Jun. 15, 2000

(51) Int. Cl.[7] ................. H01L 23/48; H01L 23/52; H01L 29/40; H01L 23/58
(52) U.S. Cl. ................. 257/758; 257/750; 257/646
(58) Field of Search ............... 257/750–764, 257/646; 438/620–640

(56) References Cited

U.S. PATENT DOCUMENTS

| | | | |
|---|---|---|---|
| 5,607,773 A | 3/1997 | Ahlburn et al. | |
| 5,661,334 A * | 8/1997 | Akram | 257/760 |
| 5,792,702 A | 8/1998 | Liang | |
| 5,937,323 A | 8/1999 | Orczyk et al. | |
| 5,946,601 A | 8/1999 | Wong et al. | |
| 5,970,373 A | 10/1999 | Allen | |
| 6,274,483 B1 * | 8/2001 | Chang et al. | 438/640 |

* cited by examiner

Primary Examiner—Cuong Qwang Nguyen
(74) Attorney, Agent, or Firm—Margaret A. Pepper (57) ABSTRACT

An interconnect structure having reduced fringing fields of bottom corners of said interconnect structure and a method of fabricating the same is provided. The interconnect structure includes one or more interconnect levels one on top of each other, wherein each interconnect level is separated by a diffusion barrier and includes a dielectric stack of at least one low-k interlayer dielectric on at least one hybrid dielectric, said dielectrics having planar interfaces therebetween, each interconnect level further comprising metallic lines formed in said low-k interlayer dielectric, with the proviso that bottom horizontal portions of said metallic lines are not coincident with said interface, and said metallic lines are contained within said low-k interlayer dielectric. The interconnect structures may be fabricated such that top horizontal portions of the metallic lines are coplanar with a top surface of the low-k interlayer dielectric.

21 Claims, 5 Drawing Sheets

CU/LOW-K BEOL WITH NONCONCURRENT HYBRID DIELECTRIC INTERFACE

FIELD OF THE INVENTION

The present invention relates to integrated circuits (ICs), and more particularly to an interconnect structure, including multilevel interconnect structures, in which dense fringing fields typically present at the bottom corners of the interconnect regions are significantly reduced. The present invention is also directed to a method of fabricating an interconnect structure having reduced fringing fields at the bottom corners of the interconnect regions.

BACKGROUND OF THE INVENTION

In back end of the line (BEOL) technology, aluminum, Al, and aluminum alloys have been used as the traditional interconnect metallurgies. While aluminum-based metallurgies have been the material of choice for use as metal interconnects over the past years, concern now exists as to whether aluminum will meet the demands as circuit density and speeds for semiconductor devices increase. Because of these growing concerns, other materials have been investigated as possible replacements for aluminum-based metallurgies.

One highly advantageous material now being used as a replacement for aluminum metallurgies is copper, Cu, and Cu alloys. This is because Cu interconnects, i.e., Cu metallic lines, exhibit a lower susceptibility to electromigration failure as compared to Al metal lines. Moreover, copper has a lower resistivity as compared to aluminum which aids in reducing the RC Time constant of a microprocessor.

In addition to the resistivity of the metallic lines, the RC Time Constant is effected by the capacitance of the interlayer dielectric (ILD) in which the metallic lines are formed. Traditionally, silicon dioxide ($SiO_2$; k=4) has been used as the interlayer dielectric material. To lower the capacitance of the interlayer dielectric, and thus lower the RC Time Constant, ILDs having a dielectric constant, k, less than $SiO_2$ are now being used. These so-called low-k ILDs include dielectric materials such as doped silicate glass, polyaromatic ethers, aerogels, xerogels and parylene polymers.

By using ILDs having lower dielectric constants than $SiO_2$ several advantages may be obtained. For example, the use of low-k ILDs has been found to reduce the RC Time Constant due to decreased capacitance. Moreover, the use of low-k ILDs has also been found to improve power dissipation and to reduce crosstalk noise between metallic lines.

The use of a single low-k ILD in interconnect structures causes via etch selectivity problems; therefore, interconnect structures containing a dielectric etch stop layer beneath the low-k ILD are now being typically employed. Specifically, it is known to utilize a dielectric stack that includes a low-k interlayer dielectric layer in which the metallic lines are formed, and an underlying dielectric material for providing etch selectivity to the interconnect structure. The underlying dielectric layer used in such structures to improve via etch selectivity has a higher dielectric constant than the interlayer dielectric and is referred to in the art as well as herein as a 'hybrid' dielectric layer.

Figure 1:
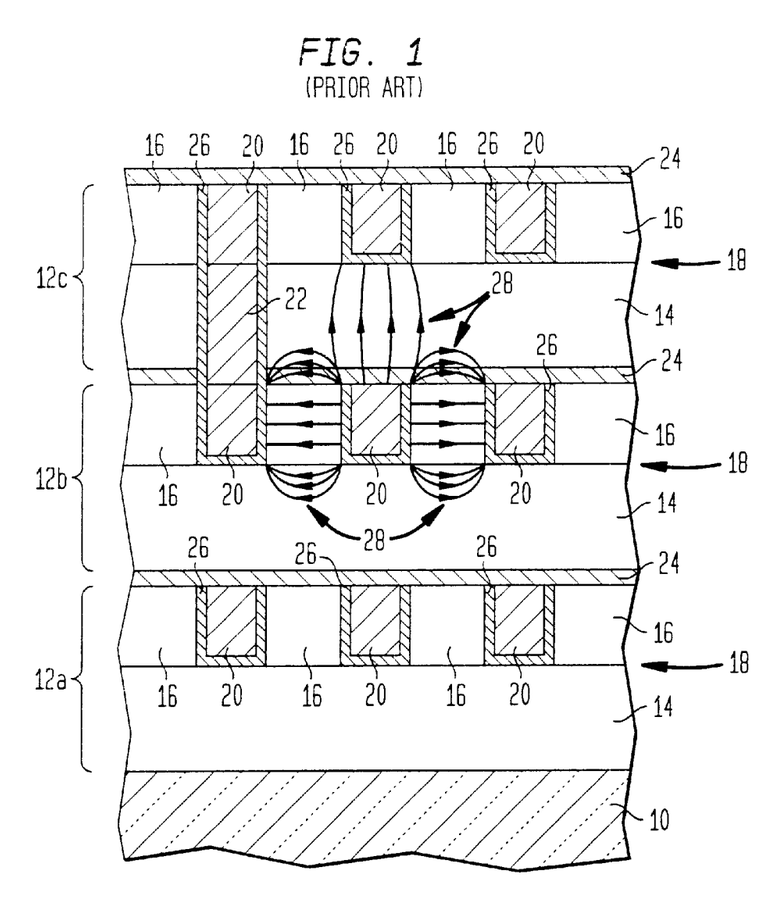
FIG. 1 is a cross-sectional view of a prior art multilevel interconnect structure wherein the bottom horizontal portions of the metallic lines are coincident with the interface between two dielectric layers of a dielectric stack.

A typical Cu/low-k BEOL structure is shown in FIG. 1. Specifically, FIG. 1 is a cross-sectional view of a prior art interconnect structure which includes three interconnect levels, labeled as 12a, 12b, and 12c, respectively. Lower interconnect level 12a is formed on a Si-containing substrate 10. Each interconnect level includes a low-k interlayer dielectric 16 formed on a hybrid dielectric layer 14 which has a higher dielectric constant than the low-k interlayer dielectric. Since these two dielectrics have different dielectric constants and are thus composed of different materials, interface 18 exists between the two different dielectrics.

Moreover, Cu lines 20 are shown in each low-k interlayer dielectric and Cu filled via 22 is shown in the uppermost hybrid dielectric layer of interconnect level 12c. A barrier layer 24 is shown separating each successive interconnect level and metallic liner 26 is shown in each metallic line and via.

A major drawback with the prior art interconnect structure of the type shown in FIG. 1 is that dense fringing fields 28 exist at the bottom corners of the metallic lines. Because the bottom corners are coincident i.e., coplanar, with dielectric interface 18, the fringing fields are not completely contained within the boundaries of the low-k dielectric. As such, increased capacitance is observed for this prior art interconnect structure.

In view of the drawbacks mentioned above in respect to prior art interconnect structures, there is a continued need to develop a new and improved low-k interconnect structure in which the capacitance of the interconnect structure is minimized.

SUMMARY OF THE INVENTION

One aspect of the present invention relates to a method of fabricating a low-k interconnect structure having reduced fringing fields at the bottom corners of the interconnect structure. Specifically, this aspect of the present invention comprises the steps of:

(a) forming a first interconnect level on a surface of a substrate, said first interconnect level including a dielectric stack of at least one low-k interlayer dielectric on at least one hybrid dielectric, said dielectrics having planar interfaces therebetween, said first interconnect level further comprising metallic lines formed in said low-k interlayer dielectric, with the proviso that bottom horizontal portions of said metallic lines are not coincident with said interface, and said metallic lines are contained within said low-k interlayer dielectric; and (b) forming a diffusion barrier on said first interconnect level.

In one embodiment of the present invention, the top horizontal portions of the metallic lines are coplanar with a top surface of the low-k interlayer dielectric. This embodiment of the present invention is highly preferred since the resultant structure has reduced capacitance as compared to a structure in which the top horizontal portions of the metallic lines are not coplanar with the top surface of the low-k dielectric.

In another embodiment of the present invention, the top horizontal portions of the metallic lines are slightly above the top surface of the low-k dielectric. In such an embodiment, a hard masking cap is present between the metallic lines, and the top portions of the metallic lines are coplanar with the top surface of the hard masking cap.

It is noted that the term "low-k interlayer dielectric" refers to any dielectric material that has a relative dielectric constant of less than 4. The term "hybrid dielectric" is used herein to denote any dielectric material that has a higher dielectric constant than said low-k interlayer dielectric which provides etch selectivity to the interconnect structure.

It should be noted that all the dielectric constants specified herein are relative dielectric constants, unless otherwise specified.

Another aspect of the present invention relates to a method of fabricating a multilevel interconnect structure having reduced fringing fields which comprises the steps of:

(a) forming a first interconnect level on a surface of a substrate, said first interconnect level including a dielectric stack of at least one low-k interlayer dielectric on at least one hybrid dielectric, said dielectrics having planar interfaces therebetween, said first interconnect level further comprising metallic lines formed in said low-k interlayer dielectric, with the proviso that bottom horizontal portions of said metallic lines are not coincident with said interface, and said metallic lines are contained within said low-k interlayer dielectric;

(b) forming a diffusion barrier on said first interconnect level; and (c) forming additional interconnect levels, one on top of each other, wherein each additional interconnect level is separated by a diffusion barrier and includes a dielectric stack of at least one low-k interlayer dielectric on at least one hybrid dielectric, said dielectrics having planar interfaces therebetween, each interconnect level further comprising metallic lines formed in said low-k interlayer dielectric, with the proviso that bottom horizontal portions of said metallic lines are not coincident with said interface, and said metallic lines are contained within said low-k interlayer dielectric.

In the above processing steps used in forming the multilevel interconnect structure, the top horizontal portions of said metallic lines may be coplanar with a top surface of said low-k interlayer dielectric or the top horizontal portions of the metallic lines may be coplanar with a top surface of the hard masking cap.

In yet another aspect of the present invention, an interconnect structure having reduced fringing fields at the bottom corners of said interconnect structure is provided. Specifically, the inventive interconnect structure comprises:

one or more interconnect levels, one on top of each other, wherein each interconnect level is separated by a diffusion barrier and includes a dielectric stack of at least one low-k interlayer dielectric on at least one hybrid dielectric, said dielectrics having planar interfaces therebetween, each interconnect level further comprising metallic lines formed in said low-k interlayer dielectric, with the proviso that bottom horizontal portions of said metallic lines are not coincident with said interface, and said metallic lines are contained within said low-k interlayer dielectric.

In the above described interconnect structure, the top horizontal portions of said metallic lines may be coplanar with a top surface of said low-k interlayer dielectric or the top horizontal portions of the metallic lines may be coplanar with a top surface of the hard masking cap.

BRIEF DESCRIPTION OF THE DRAWINGS

FIGS. 3a–b are cross-sectional views of multilevel interconnect structures of the present invention wherein the bottom horizontal portions of the metallic lines are not coincident with any of the interfaces between two dielectric layers of a dielectric stack. In FIG. 3a, the top horizontal portions of the metallic lines are coplanar with a top surface of said low-k interlayer dielectric, whereas in FIG. 3b the top horizontal portions of the metallic lines are coplanar with a top surface of a hard masking cap.

FIGS. 4a–4f are cross-sectional views depicting the various processing steps used in forming interconnect level 52b shown in FIG. 3a.

DETAILED DESCRIPTION OF THE INVENTION

The present invention which is directed to a method of fabricating a low-k interconnect structure having reduced fringing fields at the bottom corners of the interconnect regions will now be described in more detail by referring to the drawings accompanying the present application. It should be noted that in the drawings like and/or corresponding elements are referred to by like reference numerals.

Figure 2:
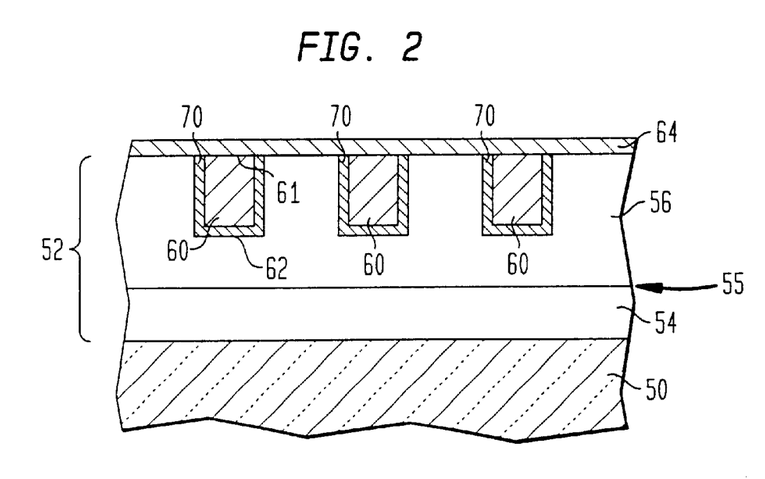
FIG. 2 is a cross-sectional view of the inventive interconnect structure wherein the bottom horizontal portions of the metallic lines are not coincident with the interface between two dielectric layers of a dielectric stack and are thus restricted to the low-k interlayer dielectric of the dielectric stack.

Reference is first made to FIG. 2 which illustrates a basic interconnect structure of the present invention which includes substrate 50 and first interconnect level 52. In the embodiments shown in FIGS. 2–3a–b, substrate 50 is a Si-containing material, while in FIGS. 4a–f, 50 is an underlying interconnect level. First interconnect level 52 is comprised of hybrid dielectric 54 and low-k interlayer dielectric layer 56.

In accordance with the embodiment shown in FIG. 2, which represents a preferred embodiment of the present invention, metallic lines 60 containing a liner material 70 are present in low-k interlayer dielectric layer 56 so that top horizontal portions 61 of the metallic lines are coplanar with the top surface of low-k interlayer dielectric 56 and that bottom horizontal portions 62 of the metallic lines are not coincident, i.e., non-coplanar, with interface 55 that exists between the two different dielectric layers of the dielectric stack. Also, the metallic lines in the inventive interconnect structure are contained solely within the low-k interlayer dielectric.

Interconnect structures in which the top horizontal portions of the metallic lines are not coplanar with the low-k dielectric are also contemplated herein. In such an interconnect structure, a hard masking cap is formed abutting the metallic lines such that the top horizontal portions of the metallic lines are coplanar with the top surface of the hard masking cap.

In accordance with the present invention, interface 55 which exists between the two dielectric layers is a flat, planar interface in which no notches are present therein. A diffusion barrier layer 64 is shown on first interconnect level 52. In some embodiments, the diffusion barrier may be replaced with a metallic barrier cap layer, or alternatively, the structure may include both a diffusion barrier and a metallic barrier cap layer which is formed above the metallic lines. For clarity, region 64 is used herein to include a diffusion barrier and a metallic barrier cap layer as well as combinations thereof.

It should be noted that the hybrid layer employed in the present invention has a somewhat higher dielectric constant than the low-k interlayer dielectric. The use of the hybrid dielectric assures that vias can be selectively etched into the structure without any etch selectivity problems.

Figure 3A:
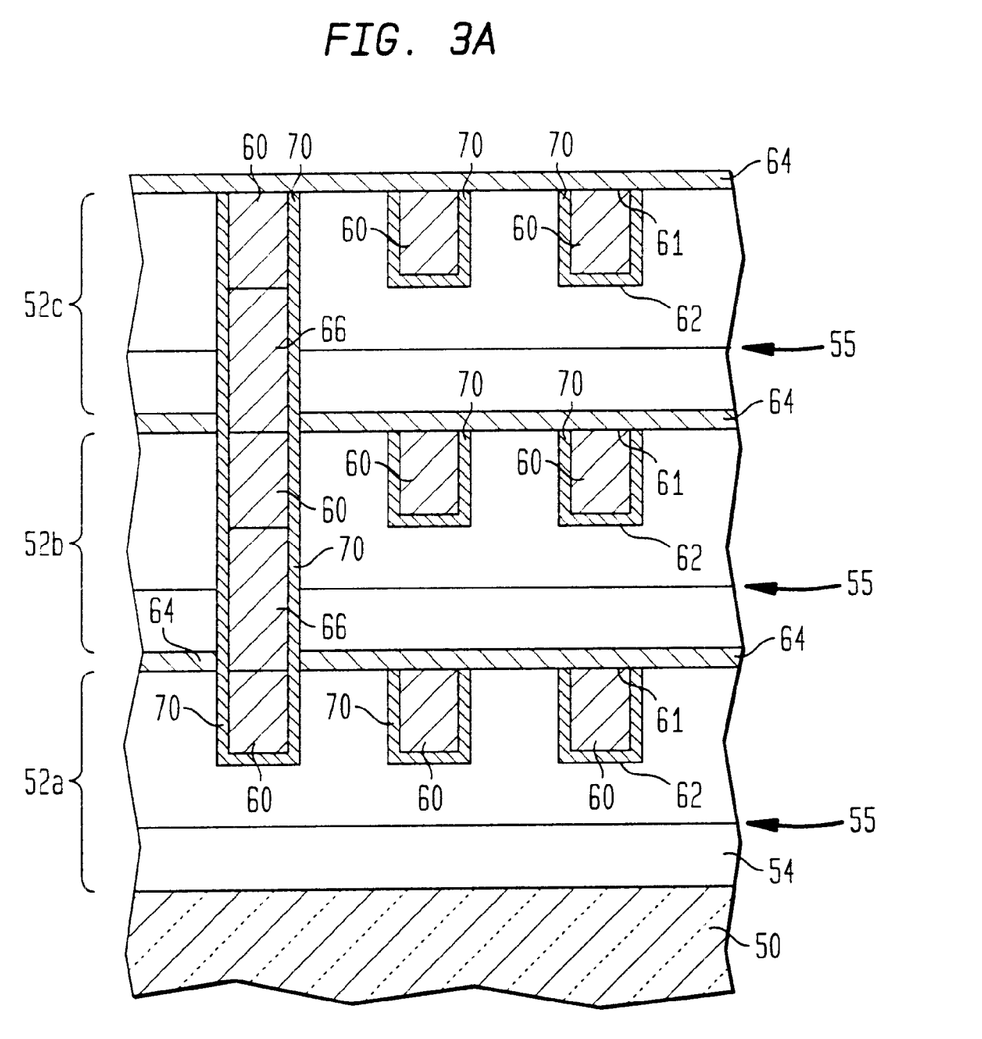

FIG. 3a shows a multilevel interconnect structure including interconnect levels 52a, 52b and 52c, respectively. Each interconnect level of the illustrated structure is separated by a barrier layer 64 and is comprised of the same elements as shown in FIG. 2. In addition to those elements, the structure shown in FIG. 3a includes metallic filled vias 66 formed in interconnect levels 52b and 52c which are in electrical contact with the metallic lines 60 of interconnect levels 52a and 52b, respectively.

Common to the inventive structures shown in FIGS. 2 and 3a is that top horizontal portions of the metallic lines are coplanar with the top surface of the low-k interlayer dielectric; that the metallic lines are contained within said low-k interlayer dielectric; and that the bottom horizontal portions of the metallic lines are not coincident with the planar interface that exists between the different dielectrics of the dielectric stack. The latter design feature is critical to the present invention since the non-coplanar configuration assures that the dense fringing fields at the bottom corners of the metallic lines are reduced and are not present in the hybrid dielectric layer. This, in turn, assures that the interconnect structures of the present invention have a lower parasitic capacitance as compared with prior art structures as shown in FIG. 1.

Figure 3B:
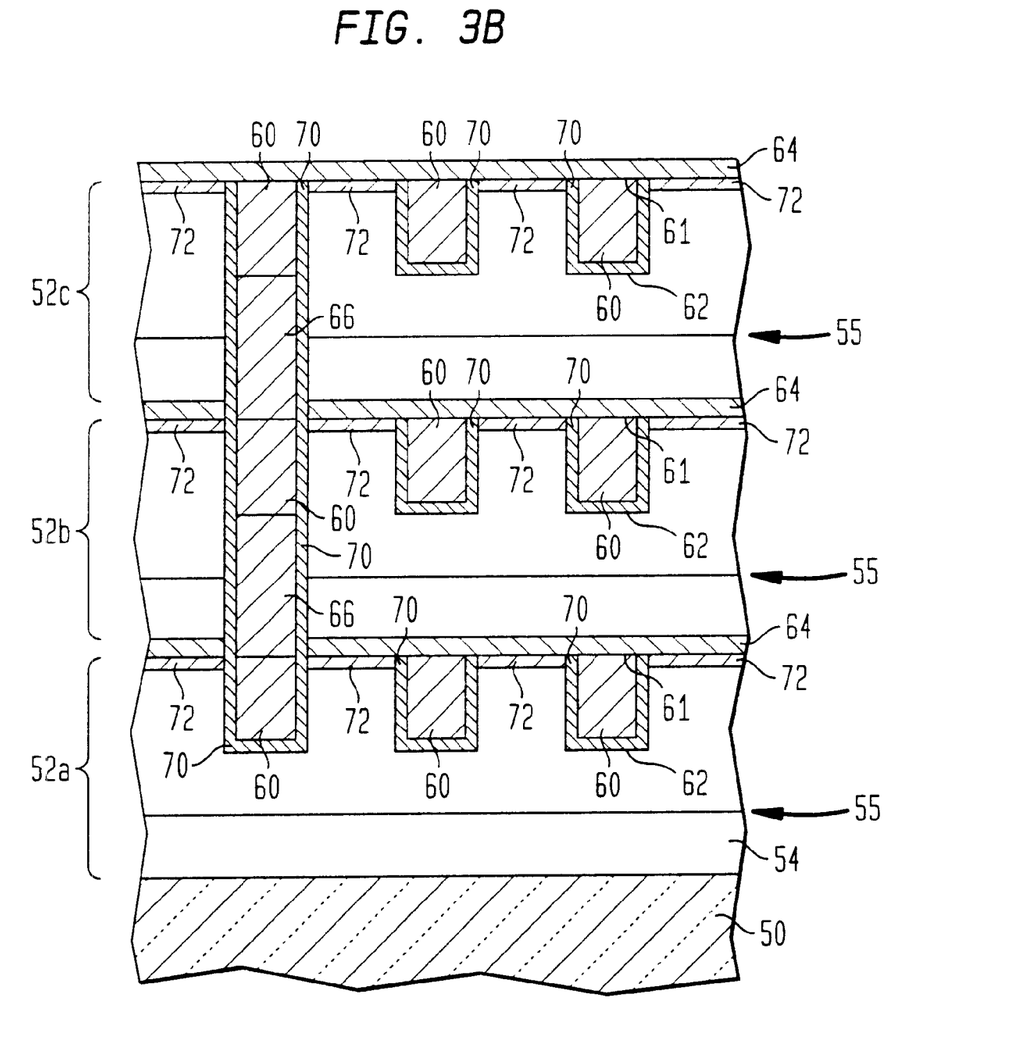

FIG. 3b shows an alternative interconnect structure of the present invention, wherein hard masking cap 72 is present on the low-k dielectric abutting the metallic lines. In this alternative interconnect structure of the present invention, the top horizontal portions of said metallic lines are not coplanar with a top surface of said low-k interlayer dielectric. Instead, the top horizontal portions of the metallic lines are coplanar with the top surface of a hard masking cap.

Before discussing how the structures of FIGS. 2–3a–b are fabricated, a description concerning the various components that make-up the structures shown in those figures will now be provided.

Substrate 50 may be a semiconductor wafer or chip which is composed of any Si-containing semiconductor material such as, but not limited to: Si, SiGe, Si/SiGe, Si/SiO$_2$/Si and other like Si-containing semiconductor materials. The substrate may be of the n or p-type depending on the desired device to be fabricated. Moreover, the substrate may contain various isolation and/or device regions either formed in the substrate or on a surface thereof. The substrate may also contain metallic pads on the surface thereof. For clarity, the above mentioned regions and metallic pads are not shown in the drawings, but are nevertheless meant to be included with substrate 50.

In addition to Si-containing semiconductor materials, substrate 50 may also be a circuit that includes CMOS devices therein, or alternatively, substrate 50 may be one of the interconnect levels of the interconnect structure. This is the case in FIGS. 4a–f wherein reference numeral 50 is an underlying interconnect level.

Hybrid dielectric 54 which improves via etch selectivity of the interconnect structure is composed of any dielectric material including low-k and high-k dielectrics; the only limitation is that the hybrid dielectric layer have a higher-k than low-k interlayer 56. Illustrative examples of low-k hybrid dielectrics include, but not limited to: carbon-, hydrogen-, methyl-(or other organic moiety), fluorine-doped silicate glass, polyaromatic ethers, aerogels, xerogels, silicon-containing polymers, hydrocarbon polymers, parylene polymers and other dielectrics that have a relative dielectric constant of less than 4.

Illustrative examples of high-k dielectrics that can be used as the hybrid dielectric layer include, but are not limited to: SiO$_2$, fluorine-doped silicate glass, Si$_3$N$_4$, SiON, SiC and other dielectrics that have a relative dielectric constant of 4 or more.

The low-k dielectric layer employed as the interlayer for containing the metallic lines is composed any of the above mentioned low-k dielectrics with the exception that this layer has a lower-k than the hybrid dielectric layer.

In one embodiment of the present invention, the dielectric layers of the dielectric stack are configured so that a substantially net zero stress exists between the two dielectric layers. This substantial net zero stress can be achieved in the present invention by fabricating one of the dielectric layers to have an internal tensile strength associated therewith, while fabricating the other dielectric layer to have an internal compressive stress associated therewith.

One highly preferred dielectric stack employed in the present invention is one wherein the hybrid dielectric layer is comprised of SiO$_2$ and the low-k interlayer dielectric is comprised of carbon- or fluorine-doped silicate glass.

The metallic lines and vias are composed of the same or different conductive material which is selected from W, Cu, Al, Ag, Au and alloys thereof. A highly preferred metal for the metallic lines and vias is Cu.

Diffusion barrier layer 64 is composed of any insulating material which is capable of preventing one of the above mentioned conductive metals from diffusing into the dielectric layers of the dielectric stack. Another important feature of the barrier layer is that it does not affect the resistivity of the metallic lines. Moreover, the barrier layer may serve as an RIE etch stop layer. Illustrative examples of such materials that can be employed as the barrier layer are: Si$_3$N$_4$, SiON, SiC and other like insulating materials that are capable of preventing the diffusion of a conductive metal into the dielectric layers.

In FIGS. 2 and 3a–b, each of the metallic lines and vias includes liner material 70 that lines the metallic lines and vias. Suitable materials that can be used as liners include, but are not limited to: TiN, TaN, Ta, WN, W and mixtures thereof. The liner may be composed of a single layer, or it may be composed of multiple layers.

In addition to a diffusion barrier, or in place thereof, the structures of the present invention may also include a metallic barrier cap layer. The metallic barrier cap layer, which is formed above the metallic lines, is composed of material such as Ni—P, Co—P, Ni—B, Co—B, Co—W—P and Co—W—B.

Figure 4A:
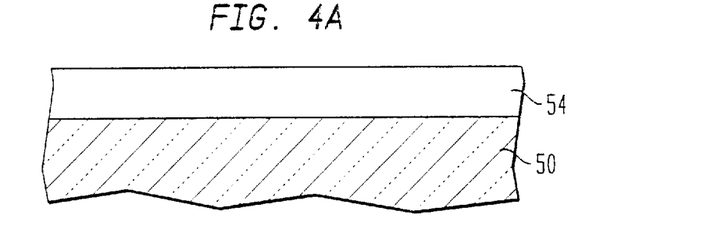

The processing steps used in fabricating the structures shown in FIGS. 2–3a–b will now be described in greater detail by referring to FIGS. 4a–4f which illustrate one embodiment for fabricating the interconnect structure of the present invention. Reference is first made to FIG. 4a wherein a hybrid dielectric layer 54 is shown on substrate 50, which is an underlying interconnect level. The hybrid dielectric is formed on the surface of the interconnect level utilizing a conventional deposition process, including, but not limited to: chemical-vapor deposition (CVD), plasma-assisted CVD, evaporation, spin-on coating, chemical solution deposition, sputtering and other like deposition processes that are capable of forming a hybrid dielectric layer on the surface of the interconnect level.

The thickness of the hybrid dielectric layer may vary depending on the method of deposition, but typically, the hybrid dielectric layer has a thickness of from about 5 to about 500 nm. If needed, the hybrid dielectric layer may be subjected to a conventional planarization process such as chemical-mechanical polishing (CMP) or grinding prior to proceeding to the next step of the present invention.

Figure 4B:
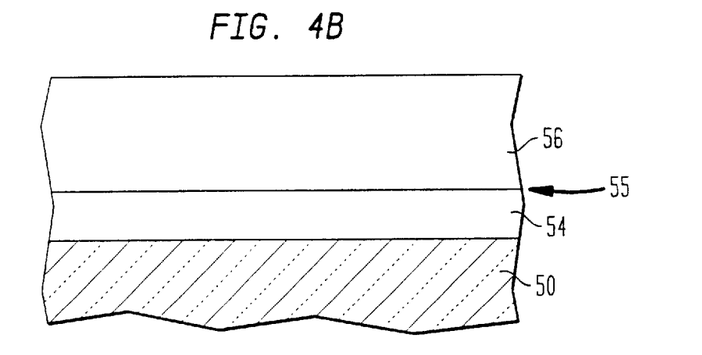

Next, as shown in FIG. 4b, low-k interlayer dielectric 56 is formed on a surface of hybrid dielectric layer so that a planar interface 55 containing no notches is formed therebetween. The low-k interlayer dielectric is formed utilizing any of the above mentioned deposition processes used in forming the hybrid dielectric layer. The thickness of the low-k interlayer dielectric may vary, but typically, the low-k interlayer dielectric has a thickness of from about 100 to about 2000 nm. The low-k interlayer dielectric may optionally be planarized prior to proceeding to the next step, which includes the formation of metallic lines and vias in the interconnect structure.

In one embodiment of the present invention, which is shown in FIG. 3b, an additional hard masking cap 72 such as $SiO_2$ or SiN is formed on the low-dielectric material utilizing conventional deposition processes. The hard masking cap layer aids in patterning in the presence of resist erosion and aids in improving the resistance to erosion of the dielectric layers during metal CMP. The additional hard masking cap is typically, but not necessarily fully or partially removed after the dielectric stack has been patterned and etched or after metal fill polishing. When a hard masking cap layer is present in the interconnect structure, the top horizontal portions of the metallic lines are coplanar with a top surface of the hard masking cap layer.

It is also within the contemplation of the present invention to have interconnect structures wherein one level of the structure has the metallic lines coplanar with a top surface of a low-k dielectric and another level wherein the metallic lines are coplanar with a top surface of a hard masking cap layer.

FIGS. 4c–4f shown the processing steps that are employed in fabricating the metallic vias and lines in the structure. Openings 68 for defining vias and lines are formed utilizing conventional lithography (including applying a photoresist to a surface of said low-k interlayer dielectric, patterning the photoresist and developing the pattern) and etching. The etching step includes any conventional dry etching process such as reactive-ion etching, ion-beam etching and plasma etching. The photoresist is then stripped from the interconnect structure utilizing conventional stripping processes well known to those skilled in the art.

Figure 4C:
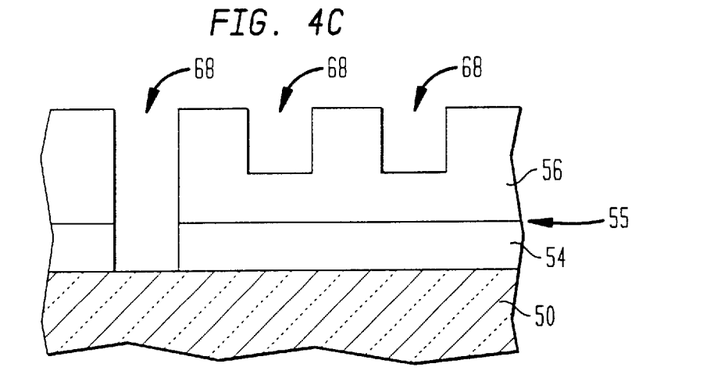

It is noted that when preparing metallic lines, the bottom of the opening is etched so that it is not coincident, i.e., coplanar, with the interface between the two dielectric layers. This is critical to the present invention in that the resultant metallic lines will have bottom horizontal portions that are also not coplanar with the dielectric interface. This design feature allows for the fringing fields to be substantially within the low-k interlayer dielectric. The openings for the vias, on the other hand, extend entirely through the dielectric stack.

Figure 4D:
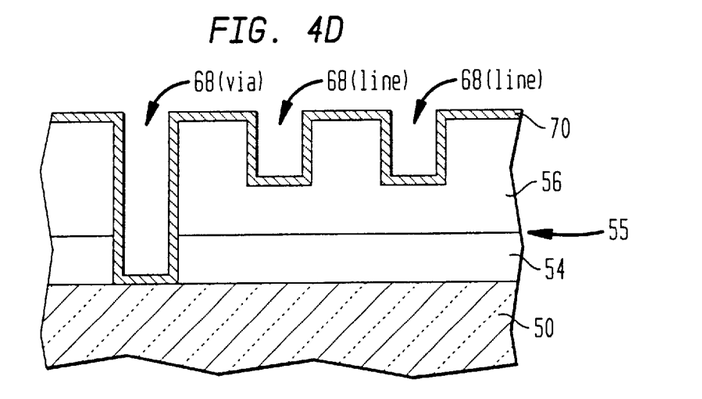
Figure 4E:
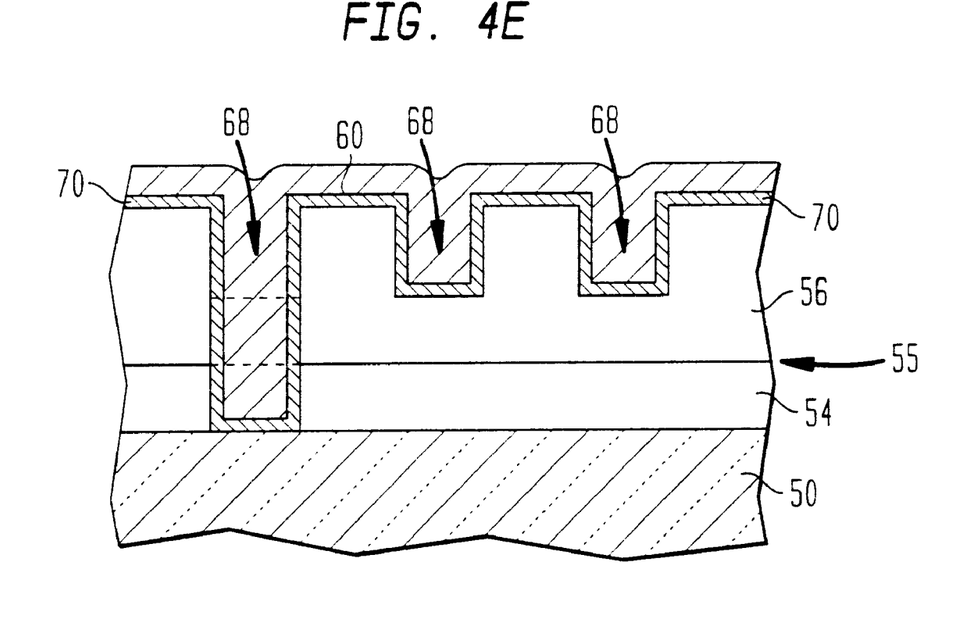
Figure 4F:
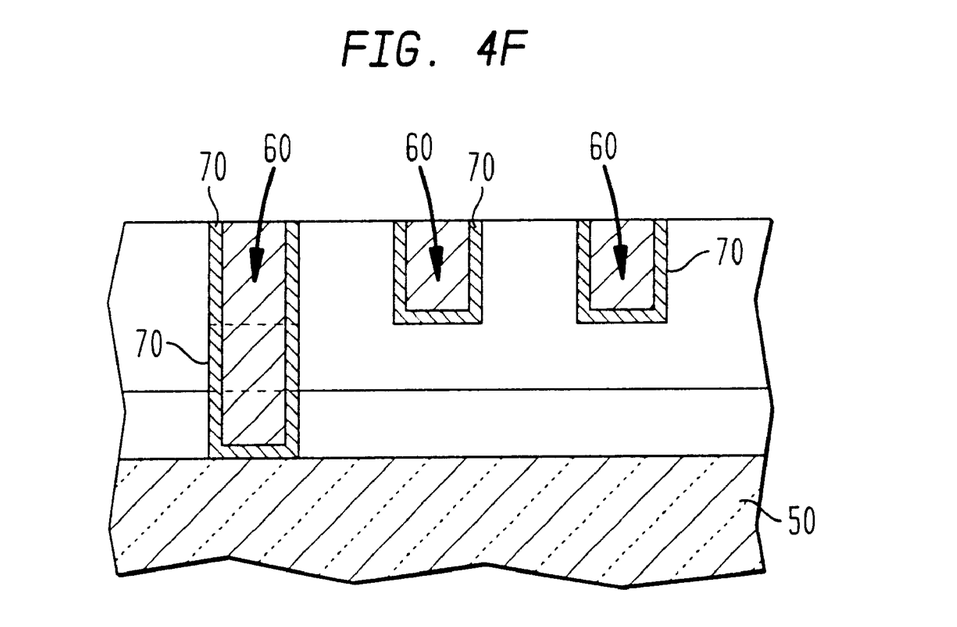

Following the formation of the openings in the low-k interlayer dielectric, the exposed surfaces of the openings may be cleaned utilizing any cleaning method well known to those skilled in the art. Next, as shown in FIG. 4d, liner 70 is formed on the exposed surfaces of the openings as well as the exposed surfaces of the low-k interlayer dielectric. The liner is formed utilizing any conventional deposition process such as evaporation, sputtering and CVD, and the optional liner typically has a thickness of from about 5 to about 100 nm.

Next, one of the above mentioned conductive materials is then formed on the liner utilizing a conventional deposition process such as CVD, plasma-assisted CVD, sputtering, plating, evaporation or chemical solution deposition. The conductively filled structure is then subjected to a conventional planarization process in which any residual conductive metal and/or liner outside the openings is removed. For, example CMP may be used in providing the structure of FIG. 4f in which the top horizontal portions of the metallic lines are coplanar with the top surface of the low-k interlayer dielectric.

The above processing steps are well known and are referred to in the art as a damascene process. In the embodiments shown in FIGS. 2, 3a and 4a–f, the damascene process assures that the top horizontal portions of the metallic lines are coplanar with the top surface of the low-k interlayer dielectric. This required coplanarity between the top horizontal surface of the metallic lines and the top surface of the low-k interlayer dielectric cannot be achieved utilizing other processes.

In one embodiment, after planarizing the metallic filled openings, a metallic barrier cap layer (not shown in the drawings) may optionally be formed on the surface of the metallic lines utilizing a self-aligned electroless deposition process. When a metallic barrier cap layer is present, the top horizontal portion of the metallic lines remain substantially coplanar with the low-k dielectric layer.

Diffusion barrier layer 64 is formed on the interconnect structure utilizing any conventional deposition process such as CVD, plasma-assisted CVD, evaporation, sputtering, and chemical solution deposition. The thickness of the diffusion barrier layer may vary and is not critical to the present invention.

The above damascene processing steps including deposition of the two dielectric layers, patterning and etching the low-k interlayer dielectric, conductive fill and planarization, may be repeated any number of times to provide a multilevel interconnect structure having the features of the present invention therein.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. An interconnect structure having reduced fringing fields at the bottom corners of said interconnect structure, said structure comprising:

one or more intent levels, one on top of each other, wherein each interconnect level is separated by a diffusion barrier and includes a dielectric stack of at least one low-k interlayer dielectric on at least one hybrid dielectric, said dielectrics having planar interfaces therebetween and said at least one hybrid dielectric having a higher dielectric constant than said at least one low-k interlayer dielectric, each interconnect level further comprising metallic lines formed in said low-k interlayer dielectric, with the proviso that bottom horizontal portions of said metallic lines are not coincident with said interface, and said metallic lines are contained solely within said low-k interlayer dielectric, wherein said hybrid dielectric is comprised of a different low-k dielectric from said low-k dielectric and is selected from the group consisting of carbon-, hydrogen-, methyl- or fluorine-doped silicate glass, polyaromatic ethers, aerogels, xerogels, silicon-containing polymers, hydrocarbon polymers, parylene polymers and other dielectrics having a relative dielectric constant of less than 4.

2. The interconnect sanctum of claim 1 comprising a first interconnect level formed on a surface of a Si-containing substrate or a circuit.

3. The interconnect structure of claim 1 wherein said hybrid dielectric is selected from the group consisting of of $SiO_2$, fluorine-doped silicate glass, $Si_3N_4$, SiC, SiON and other dielectrics having a relative dielectric constant of 4 or more.

4. The interconnect structure of claim 1 wherein said metallic lines are composed of the same or different conductive material.

5. The interconnect structure of claim 4 wherein said conductive material is selected from the group consisting of W, Cu, Al, Ag, Au and alloys thereof.

6. The interconnect structure of claim 5 wherein said conductive material is Cu.

7. The interconnect structure of claim 1 wherein said diffusion barrier layer is selected from the group consisting of $Si_3N_4$, SiON and SiC.

8. The interconnect structure of claim 1 wherein top horizontal portions of said metailic lines are coplanar with a top surface of said low-k interlayer dielectric.

9. The interconnect structure of claim 1 wherein top horizontal portions of said metallic lines are coplanar with a top surface of a hard masking cap that is formed on said low-k interlayer dielectric.

10. The interconnect structure of claim 1 further comprising a liner formed in said metallic lines.

11. The interconnect stricture of claim 10 wherein said liner is selected from the group consisting of TiN, TaN, Ta, W, WN and mixtures and multi-layer thereof.

12. An interconnect structure having reduced fringing fields at the bottom corners of said interconnect structure, said structure comprising:

one or more interconnect levels, one on top of each other, wherein each interconnect level is separated by a diffusion barrier and includes a dielectric stack of at least one low-k interlayer dielectric on at least one hybrid dielectric, said dielectrics having planar interfaces therebetween and said at least one hybrid dielectric having a higher dielectric constant than said at least one low-k interlayer dielectric, each interconnect level further comprising metallic lines formed in said low-k interlayer dielectric, with the proviso that bottom horizontal portions of said metallic lines are not coincident with said interface, and said metallic lines are contained solely within said low-k interlayer dielectric, wherein said hybrid dielectric is comprised of $SiO_2$ and said low-k interlayer dielectric is comprised of carbon- or fluorine-doped silicate glass.

13. The interconnect structure of claim 12 comprising a first interconnect level formed on a surface of a Si-containing substrate or a circuit.

14. The interconnect structure of claim 12 wherein said metallic lines are composed of the same or different conductive material.

15. The interconnect structure of claim 14 wherein said conductive material is selected from the group consisting of W, Cu, Al, Ag, Au and alloys thereof.

16. The interconnect structure of claim 15 wherein said conductive material is Cu.

17. The interconnect structure of claim 12 wherein said diffusion barrier layer is selected from the group consisting of $Si_3N_4$, SiON and SiC.

18. The interconnect structure of claim 12 wherein top horizontal portions of said metallic lines are coplanar with a top suds of said low-k interlayer dielectric.

19. The interconnect structure of claim 12 wherein top horizontal portions of said metallic lines are coplanar with a top sudlice of a hard masking cap that is formed on said low-k interlayer dielectric.

20. The interconnect structure of claim 12 further comprising a liner formed in said metallic lines.

21. The interconnect structure of claim 20 wherein said liner is selected from the group consisting of TiN, TaN, Ta, W, WN and mixtures and multi-layers thereof.

* * * * *

UNITED STATES PATENT AND TRADEMARK OFFICE
CERTIFICATE OF CORRECTION

PATENT NO.   : 6,548,901 B1
DATED        : April 15, 2003
INVENTOR(S)  : William Cote et al.

It is certified that error appears in the above-identified patent and that said Letters Patent is hereby corrected as shown below:

Column 8,
Line 46, cancel Claim 1 and insert the following claim:

An interconnect structure having reduced fringing fields at the bottom corners of said interconnect structure, said structure comprising:
one or more interconnect levels, one on top of each other, wherein each interconnect level is separated by a diffusion barrier and includes a dielectric stack of at least one low-k interlayer dielectric on at least one hybrid dielectric, said dielectrics having planar interfaces therebetween and said at least one hybrid dielectric having a higher dielectric constant than said at least one low-k interlayer dielectric, each interconnect level further comprising metallic lines formed in said low-k interlayer dielectric, with the proviso that bottom horizontal portions of said metallic lines are not coincident with said interface, and said metallic lines are contained solely within said low-k interlayer dielectric, wherein said hybrid dielectric is comprised of a different low-k dielectric from said low-k dielectric and is selected from the group consisting of carbon-, hydrogen-, methyl- or fluorine-doped silicate glass, polyaromatic ethers, aerogels, xerogels, silicon-containing polymers, hydrocarbon polymers, parylene polymers and other dielectrics having a relative dielectric constant of less than 4.

Column 9,
Line 4, cancel Claim 2 and insert the following:
The interconnect structure of Claim 1 comprising a first interconnect level formed on a surface of a Si-containing substrate or a circuit.

Signed and Sealed this

Sixteenth Day of September, 2003

JAMES E. ROGAN
*Director of the United States Patent and Trademark Office*